United States Patent

Fujikawa et al.

[15] 3,668,439

[45] June 6, 1972

[54] MAGNETICALLY OPERATED SEMICONDUCTOR DEVICE

[72] Inventors: Kyoichiro Fujikawa; Saburo Takamiya, both of Itami, Japan

[73] Assignee: Mitsubishi Denki Kabushiki Kaisha, Marunochi, Chiyoda-ku, Tokyo, Japan

[22] Filed: Sept. 4, 1970

[21] Appl. No.: 69,867

[30] Foreign Application Priority Data

| | | |
|---|---|---|
| Sept. 11, 1969 | Japan | 44/72195 |
| Oct. 31, 1969 | Japan | 44/87397 |
| Dec. 16, 1969 | Japan | 44/101189 |

[52] U.S. Cl. ....................307/309, 317/235

[51] Int. Cl. ....................H01l 11/00, H01l 15/80

[58] Field of Search ....................317/235

[56] References Cited

UNITED STATES PATENTS

| | | | |
|---|---|---|---|
| 2,736,822 | 2/1956 | Dunlap, Jr. | 317/235 X |
| 3,050,698 | 8/1922 | Brass | 317/235 X |
| 3,389,230 | 6/1968 | Hudson, Jr. | 317/235 X |
| 3,413,712 | 12/1968 | Engel | 317/235 X |

*Primary Examiner*—James D. Kallam
*Attorney*—Robert E. Burns and Emmanuel J. Lobato

[57] ABSTRACT

In PNP transistors a transverse electric field is established in the base embraced by two opposite collectors whose direction is parallel to the emitter disposed on the base. A magnetic field is applied across the transistor perpendicularly to the emitter junction originally biased to zero. The Hall effect serves to deflect electrons flowing through the base toward either one of the end portions of the emitter junction to forwardly bias it. That collector adjacent the forwardly biased emitter end provides an output. In PNPN devices the emitter traverses the first base in which the majority carriers stream. A magnetic field is applied to the stream as in the above mentioned transistor to turn the device ON.

21 Claims, 18 Drawing Figures

MAGNETICALLY OPERATED SEMICONDUCTOR DEVICE

BACKGROUND OF THE INVENTION

This invention relates in general to magnetically operated semiconductor devices and more particularly to transistors or four layer semiconductor elements, that is, thyristors utilizing the Hall effect.

It is well known that semiconductor devices employing the Hall effect are being widely utilized as transformers for converting a magnetic signal to a corresponding electric signal, and as contact-less switches for electrically performing a switching operation through the utilization of a magnetic variation. The conventional type of Hall effect element has been constructed and operated in accordance with the principles that a potential difference induced across the Hall terminals or a difference between currents flowing into the Hall terminals is taken out as it stands. Therefore such elements have been relatively low in sensitivity.

SUMMARY OF THE INVENTION

The invention contemplates to improve the sensitivity to magnetism of semiconductor devices utilizing the Hall effect by integrally incorporating the Hall effect element of the conventional construction into a transistor or a thyristor so that a redistribution of the charge due to the Lorentz's force is directly converted in the transistor or thyristor into a change in voltage across the emitter and base regions involved.

It is an object of the invention to provide a new and improved semiconductor device such as a transistor or a thyristor magnetically responsive and high in sensitivity.

It is another object of the invention to provide a new and improved semiconductor device magnetically operative with a high sensitivity by taking effective advantage of the amplification function provided by the associated transistor.

It is still another object of the invention to provide a new and improved, magnetically operated semiconductor device in which an electromotive force due to the Hall effect is produced substantially parallel to a plane of an emitter semiconductor junction involved, thereby to greatly increase the property sensitive to magnetism.

It is a further object of the invention to provide a new and improved, magnetically operated semiconductor device capable of effectively controlling a voltage across the emitter and collector regions therein.

It is a still further object of the invention to provide a new and improved, magnetically operated semiconductor device in which a current flowing from the emitter to the collector thereof is low in useless component.

It is another object of the invention to provide a new and improved, magnetically operated semiconductor device in which a potential difference between the emitter and collector regions therein can preliminarily be adjusted in an easy manner.

It is still another object of the invention to provide an improved, magnetically operated semiconductor device including an emitter region disposed substantially orthogonally to an electric field applied thereto or an electric current flowing therethrough, thus leading to a decrease in useless current while decreasing an undesirable current capacity.

It is an additional object of the invention to provide magnetically operated semiconductor devices having a wide variety of the applications to the fields of magnetic measurements, magnetic tape readers, key board switches, transformer secondaries, memories, contact-less volume controls, and switching devices therefor etc.

The invention accomplishes the above cited objects by the provision of a magnetically operated semiconductor device comprising a wafer of semiconductive material including a collector region of one type conductivity, a base region of other type conductivity to form a collector junction between the same and the collector region, and an emitter region of one type conductivity to form an emitter junction between the same and one portion of the base region, and means for applying a magnetic field across the device, characterized by a pair of electrodes disposed in ohmic contact with the base region to interpose said emitter region therebetween, a source of direct current connected across the pair of electrodes to produce a transverse electric field or an electric current in that portion of the base region disposed between the electrodes, the emitter region having a surface disposed in substantially parallel relationship with respect to the direction of the transverse electric field or the direction of the current, the magnetic field being substantially perpendicular to the surface of the emitter junction to generate an electromotive force in parallel to the surface of the emitter junction due to the Hall effect resulting from the interaction of the magnetic field and the transverse electric field or the electric current.

The base region may be preferably greater in area than the emitter junction in order to effectively control a voltage across the emitter and base regions with a change in the electromotive force due to a variation in the magnetic field.

Advantageously the base region may be operatively coupled to at least two collector regions to form at least two transistors so that a change in the applied magnetic field causes a variation in electromotive force due to the Hall effect, thereby to increase a collector current from one of the transistors while at the same time decreasing a collector current from the other transistor.

The emitter region may be preferably disposed on the base region substantially orthogonally to the direction of the transverse electric field or the direction of the current produced in the base region.

A pair of the emitter regions may be disposed on the base region such that a direction in which the emitter regions are aligned with each other is substantially perpendicular to the direction of the transverse electric field or the direction of the current, and a source of direct current is connected across the pair of emitter region and the collector regions to provide a signal from the emitter regions resulting from a change in emitter currents caused by a variation in electromotive force due to the Hall effect. The invention is further applicable to four layer semiconductor devices including the emitter region, the first base region, the second base region and the collector region of alternate conductivity. The emitter region may be elongated and disposed traverse of the entire first base region. A source of direct current is connected across a pair of ohmic electrodes disposed on the first base region to interpose the emitter region therebetween to produce a transverse electric field or an electric current in the first base region between the electrodes and in a direction substantially parallel to a surface of an emitter junction formed between the emitter and first base regions. A magnetic field is applied across the device substantially perpendicularly to the surface of the emitter junction to generate an electromotive force in parallel to the surface of the emitter junction due to the Hall effect resulting from the interaction of the magnetic field and the transverse electric field or the electric current.

BRIEF DESCRIPTION OF THE DRAWINGS

The invention will become more readily apparent from the following detailed description taken in conjunction with the accompanying drawings in which.

DESCRIPTION OF THE PREFERRED EMBODIMENTS

Figure 1:
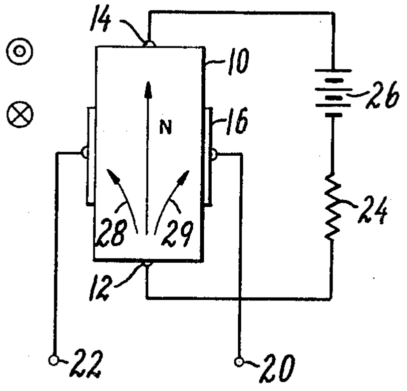
FIG. 1 PRIOR ART
FIG. 1 is a schematic diagram illustrating a Hall effect element constructed in accordance with the principles of the prior art along with an energizing circuit therefor.

Referring now to the drawings and FIG. 1 in particular, there is illustrated the most generic form of Hall effect elements constructed in accordance with the principles of the prior art. The arrangement illustrated comprises a rectangular wafer 10 of any suitable N type semiconductive material, a pair of electrodes 12 and 14 disposed in ohmic contact with a pair of opposite faces of the wafer 10 and another pair of electrodes 16 and 18 disposed in ohmic contact with another pair of opposite faces of the wafer 10 in quadrature relationship with respect to the electrodes 12 and 14. The electrodes 16 and 18 provide the so-called Hall electrodes connected to a pair of output terminals 20 and 22 respectively. On the other hand, the electrode 12 is shown in FIG. 1 as being connected through a resistor 24 to a negative side of a source 26 of direct current while the electrode 14 is connected directly to the positive side of the source 26.

Under these circumstances, the electrode 12 injects the majority carriers, in this case electrons, into the wafer 10 so that they may drift toward the opposite electrode 14 as shown at the central straight arrow within the block for the wafer 10. If a magnetic field is applied across the wafer 10 perpendicularly to the plane of FIG. 1 in such a direction that it points from the rear to the front side of the plane of FIG. 1 as shown at the symbol "double circle" on the lefthand portion of the same Figures then the stream of electrons is deflected toward the Hall effect electrode 18 by means of the action of a Lorentz's force as shown at the curved arrow 28. The Lorentz's force results from the interaction of the magnetic field and the stream of electrons or the transverse electric field established in the wafer 10 by the source 26. As a result, the density of electrons becomes higher in the vicinity of the electrode 18 and lower in the vicinity of the opposite electrode 16 leading to the generation of a Hall voltage, or an electromotive force across the Hall electrodes 18 and 16 due to the Hall effect. On the contrary, if the magnetic field is reversed in polarity to point from the front to the rear side of the plane of FIG. 1, as shown at the symbol "cross within circle" on the lefthand portion of the same Figures, then the stream of electrons is deflected toward the Hall electrode 16 as shown at the arrow 29 in FIG. 1. As a result, the density of electrons becomes higher in the vicinity of the electrode 16 and lower in the vicinity of the electrode 18. Therefore the electrodes 16 and 18 have generated thereacross a Hall voltage opposite to the voltage as above described.

The Hall voltage $V_H$ is expressed by the equation $$V_H = (R_H I_c H)/(t)$$

where $R_H$ is a Hall coefficient, $I_c$ is a current flowing through the Hall element or wafer 10 between the electrodes 14 and 12, $H$ is a magnetic field strength and $t$ is the thickness of the wafer. From the above equation it is seen that the Hall voltage $V_H$ increases with an increase in current $I_c$.

Figure 2:
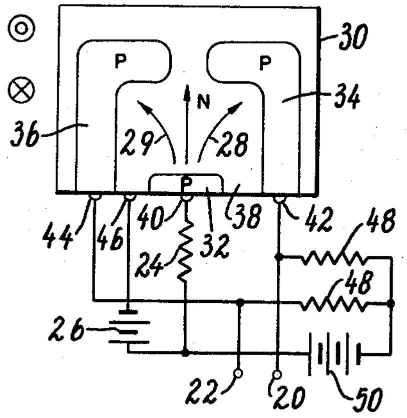
FIG. 2 PRIOR ART
FIG. 2 is a diagram similar to FIG. 1 but illustrating a transistor including a Hall effect element constructed in accordance with the principles of the prior art.

FIG. 2 shows a transistor having a Hall element incorporated thereinto in accordance with the principles of the prior art. The arrangement illustrated comprises a substrate 30 of N type semiconductive material, and a P type emitter region 32 and a pair of P type opposite collector regions 34 and 36 diffused into the substrate 30 to embrace the emitter region 32 to form therebetween a gap providing a base region 38. Also, an emitter junction (not shown) is formed between the emitter and base regions 32 and 38 respectively and collector junctions (not shown) are formed between the collector regions 34 and 36 and base region 38.

The arrangement further comprises an emitter electrode 40 affixed to the emitter region 32, collector electrodes 42 and 44 affixed to the collector regions 34 and 36 respectively, and base electrode 44 affixed to the base region 38. Thus a PNP type transistor has been is formed. The emitter electrode 40 is connected through a resistor 24 to a positive side of a source 26 of direct current and the base electrode 46 is connected directly to the negative side of the source 26 to forwardly bias the emitter junction. The collector electrodes 42 and 44 are connected to a pair of output terminals 20 and 22, respectively, and through individual resistors 48 to a negative side of another source 50 of direct current having its positive side connected to the positive side of the source 26. Therefore the source 50 reversely biases the collector junctions through the resistors 48.

Under these circumstances, holes are injected into the base region 38 from the emitter region 32 to flow through the base region in the direction of the central straight arrow denoted in the block for the substrate 30. As in the arrangement of FIG. 1, the application of a magnetic field across the transistor in a direction normal to the plane of FIG. 2, cooperates with a transverse electric field established in the base region 38 by the source 26 to cause the stream of holes to be deflected toward one or the other of the collector regions 34 and 36 in accordance with the polarity of the applied field. More specifically, if the magnetic field points from the rear to the front side of the plane of FIG. 2, as shown at the symbol "double circle," then the stream of holes is deflected toward the collector region 34 as shown at the curved arrow 28, while if the magnetic field points from the front to the rear side of the plane of FIG. 2, as shown by at the symbol "cross in circle," then the stream of holes is deflected toward the collector region 36 as shown at the curved arrow 29 in FIG. 2. In this way, a proportion of the number of the holes flowing into either of the collector regions 34 or 36 can vary. Therefore the collector region 34 is different from the collector region 36 in the number of holes flowing thereinto which, in turn, reflects on voltage drops across the resistors 48 due to the source 50. That is, the difference in the number of incoming holes between the collector regions 34 and 36 is provided at the output terminals 20 and 22 as a difference in voltage drop between both resistors 48.

In the arrangement of FIG. 2, the Lorentz's force is adapted to be exerted on the holes being drifted through the thickness of the base region 38 from the rear to the front side of the plane of FIG. 2, while transverse electric fields are only established in the vicinity of the emitter junction or of the interface of the regions 32 and 38 and of the collector junctions or the interfaces of the region 38 and the regions 34 and 36. Accordingly the Lorentz's force can be effective over a narrow range and hence can not change the stream of holes to a great extent. In other words, the arrangement as shown in FIG. 2 cannot provide a large rate of change in the number of the holes flowing into either of the two collector regions 34 and 36, due to the effect of the applied magnetic field or the Hall effect upon the stream of the holes. A rate of change in collector current does not depend upon the collector current. The term "rate of change in collector current" is defined as $\Delta I_c/I_c$, where $I_c$ is the magnitude of the collector current and $\Delta I_c$ is an increment thereof. An increase in collector current $I_c$ flowing into the collector region from the adjacent emitter region results in an increase in response of the current to the applied magnetic field. That response is defined as $\Delta I_c/H$ where $\Delta I_c$ is an increment of the collector current and $H$ is a magnetic field intensity. This is caused from the effect quite identical to that expressed by the equation as above described. Therefore it will be appreciated that the arrangement of FIG. 2 does not utilize the amplification function of the transistor involved.

The invention contemplates the elimination of the disadvantages of the prior art practice as above described by the provision of a semiconductor device including a Hall effect element increased in sensitivity to magnetism through the utilization of the amplification function of a transistor involved.

Figure 3:
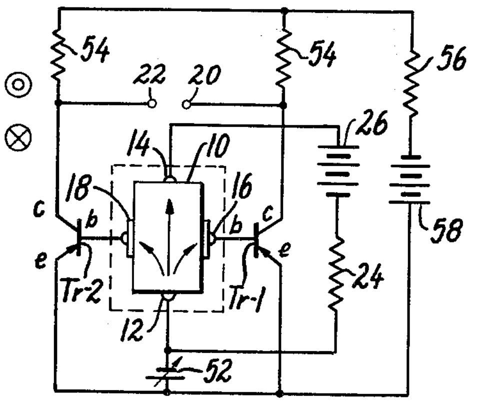
FIG. 3 is a schematic circuit diagram useful in explaining the principles of the invention.

The principles of the invention will now be described in conjunction with FIG. 3 wherein like reference numerals designate the components identical or corresponding to those shown in FIG. 1. In FIG. 3, the Hall effect element 10 as shown in FIG. 1 is illustrated within a dotted rectangle and the electrodes 12 and 14 are connected across the source 26 through the resistor 24 as previously described in conjunction with FIG. 1. However the Hall electrodes 16 and 18 are connected respectively to a pair of p-n-p type transistors Tr-1 and -2 at the base electrodes *b*. The transistors Tr-1 and -2 include the respective emitter electrodes *e* connected together to a positive side of a variable source 52 of direct current and the respective collector electrodes *c* connected to a pair of output terminals 20 and 22, respectively, and also interconnected through resistors 54 respectively. Then the junction of the resistors 54 is connected through a resistor 56 to a negative side of a source 58 of direct current having its positive side connected to both the positive side of the variable source 52 and the emitter electrodes *e* of both transistors. Thus it is seen that the source 52 forwardly biases the emitter junctions of both transistors Tr-1 and -2 while the source 58 reversely biases the collector junctions thereof.

With the arrangement illustrated, a Hall voltage developed across the Hall electrodes 16 and 18 is adapted to be taken out therefrom after it has been amplified by the transistors Tr-1 and -2 by directly connecting the Hall voltage across the base electrodes of both transistors to automatically bias the emitter junction of either one of both transistors in the forward direction while at the same time the emitter junction of the other transistor is reversely biased. In this respect the invention is inherently different from the prior art practice as previously described in conjunction with FIGS. 1 and 2.

The physical phenomena on which the invention is based will now be described with reference to FIGS. 4 and 5 wherein there is illustrated a double collector transistor constructed in accordance with the principles of the invention through the use of a planar technique well known in the art. The transistor illustrated comprises a substrate 60 of N type semiconductive material, a pair of P type opposite collector regions 62 and 64 diffused into the substrate 60 and an N type region 66 diffused into the P type collector regions 62 and 64 and into that portion of the substrate 60 sandwiched between the collector regions to form one p-n collector junction 68 or 70 between each of the P type collector regions 62 or 64 and the N type region 66 (see FIG. 5), while the outer peripheral C-shaped surfaces of the collector regions 62 and 64 exposed to the surface of the substrate 60 embrace the N type region 66. The N type region 66 provides a base region and also plays a central role in causing the majority carriers to flow therethrough to exhibit the Hall effect.

Figure 4:
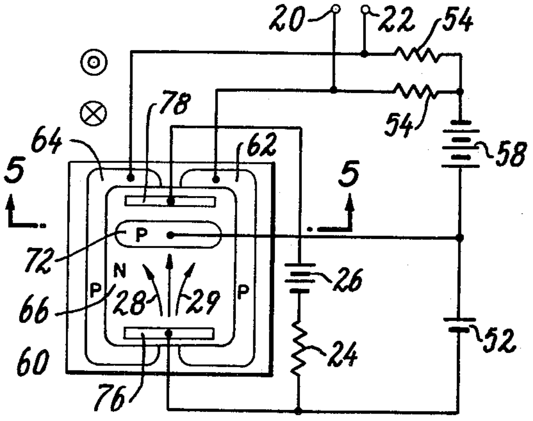
FIG. 4 is a schematic diagram illustrating a magnetically operated semiconductor device constructed in accordance with the principles of the invention along with an energizing circuit therefor.
Figure 5:
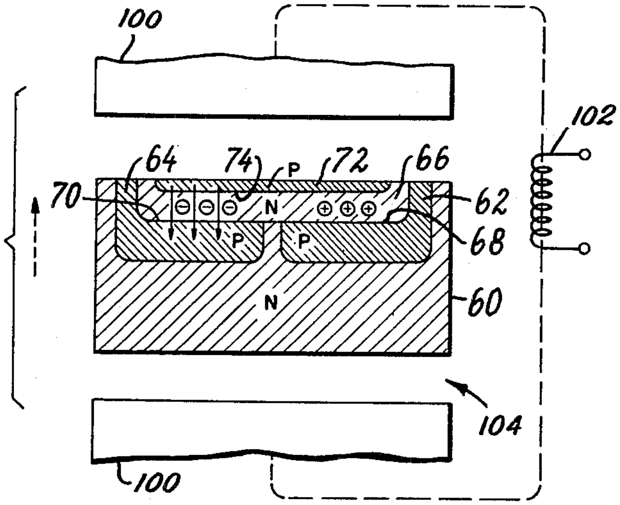
FIG. 5 is a cross sectional view of the device taken along the line V—V of FIG. 4.

Then a P type elongated region 72 serving as an emitter region is diffused into a predetermined portion of the N type base region 66 to form a p-n emitter junction 74 therebetween (see FIG. 5). A pair of spaced parallel base electrodes 76 and 78 are disposed in ohmic contact with the base region 66, adjacent the opposite edges on which the exposed ends of both collector regions 62 and 64 face each other, so that the emitter region 72 is interposed between and spaced away from the electrodes 76 and 78. The emitter region 72 and the electrodes 76 and 78 are shown in FIG. 4 as being disposed in substantially parallel relationship for the purpose as will be apparent hereinafter. In this way, the regions 62, 66 and 72 of alternate conductivity form one PNP type transister portion corresponding to one of the transistors Tr-1 and -2 as shown in FIG. 3, and the regions 64, 66 and 72 form the other PNP type transistor portion corresponding to the other of the transistors as shown in FIG. 3. Also the electrodes 76 and 78 correspond respectively to the electrodes 12 and 14 as shown in FIG. 3.

As in the arrangement of FIG. 3, the collector regions 62 and 64 are connected to a pair of output terminals 20 and 22, respectively, and through individual resistors or load 54 to a negative side of a source 58 of direct current. The resistors 54 may be equal in magnitude of resistance or impedance to each other. Alternatively, with the above-mentioned transistor portions different in characteristics from each other, at least one of the resistors 54 may be variable in magnitude of resistance or impedance for the purpose of adjusting the output current from the associated transistor portion as will be described hereinafter.

The emitter region 72 is connected to the junction of positive sides of the source 58 and a biasing source 52 of direct current, and the electrode 76 is connected to the negative side of the biasing source 52. The source 52 is adapted to reversely bias the collector junctions 68 and 70 while at the same time applying a substantially null bias across the emitter junction 74. More specifically, a voltage across the source 26 is applied across the base electrodes 76 and 78 to establish a transverse electric field within the base region 66 therebetween. Thus that portion of the base region 66 located adjacent the emitter region 72 is put at a certain potential with respect the electrode 76. Therefore the source 52 can be adjusted so as to apply to the emitter region 72 a potential opposite and substantially equal to the potential just described, thereby to apply a substantially null bias across the emitter and base regions or the emitter junction. If desired, however, the emitter junction 74 may be forwardly biased. In the latter case the emitter junction 74 is adapted to receive a Hall voltage due to a variation in magnetic field as will be described later.

It will be understood that the emitter, and collector regions each are provided with an ohmic electrode through which the necessary voltage is applied thereto, although such electrodes are not illustrated in FIGS. 4 and 5.

The source 26 establishes a transverse electric field in the base region 66 between the electrodes 76 and 78 as above described and causes the majority carriers, in this case, the electrons to flow through the base region 66 from the electrode 76 to the electrode 78 as shown at the central straight arrows denoted on the base region 66 in FIG. 4. As the emitter region 72 is disposed in substantially parallel relationship with the electrodes 76 and 78, the emitter junction 74 has its surface substantially perpendicular to the direction of the transverse electric field or the direction of the stream of electrons.

If a magnetic field is applied across the transistor perpendicularly to the main faces thereof and it points, for example, from the rear to the front side of the plane of FIG. 4 (which is represented by the symbol "double circle" shown on the lefthand portion of FIG. 4), then the stream of electrons is deflected into the direction of the curved arrow 28 shown in FIG. 4. If the field is reversed in polarity to point from the front to the rear side of the plane of FIG. 4 as shown by the symbol "cross in circle" on the lefthand portion of the same Figure, then the stream of electrons is deflected into the direction of the curved arrow 29.

Referring to FIG. 5 wherein the dotted arrow shows the polarity of the magnetic field applied across the transistor, and wherein the magnetic field results from an electromagnet core 100 having an exciting winding 102 wound thereon, and an air-gap 104 for receiving the arrangement of FIG. 5 therein, it is seen that that portion of the base region 66 adjacent the collector region 64 is enhanced in electrons whereas that portion of the base region 66 adjacent the collector region 62 is depleted in electrons to behave as if it is enhanced in holes. As a result, the base potential decreases in the vicinity of the collector region 64 whereas the base potential increases in the vicinity of the collector region 62. Therefore, that portion of the emitter junction 74 adjacent the collector region 64 is forwardly biased while at the same time that portion of the junction 74 adjacent the collector region 62 is reversely biased, although the entire emitter junction 74 has been originally biased with a substantially null voltage.

Considering only either one of the transistor portions 62–66–72 and 64–66–72, the base region 66 is larger in area than the transistor portion under consideration as seen in FIG. 5. That is, the base region 66 is larger in area than any of the emitter junction 74 and the collector junctions 68 and 70. This is because an electromotive force due to the Hall effect causes a potential difference within the base region thereby to control the operation of the transistor. On the other hand, if the base region is equal in area to the transistor portion or any of the emitter and collector junctions, a difference in electromotive force that may be produced within the base region due to the Hall effect is not so effective for controlling the operation of the transistor.

Figure 6A:
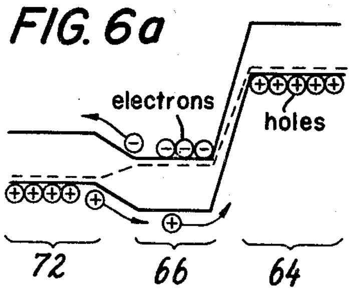
FIGS. 6a and b are diagrams of energy bands within the device shown in FIGS. 4 and 5.
Figure 6B:
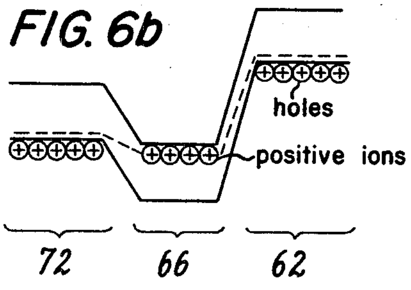

FIGS. 6*a* and *b* show the energy bands appearing in the vicinity of the collector region 64 or 62 respectively. In FIG. 6*a* the emitter region 72 is biased forwardly with respect to the base region 66 in the vicinity of the collector region 64 to permit the electrons to be injected into the same from the base region 64 while permitting the holes to be injected into the base region 66 from the emitter region 72. This results in a high current flowing through the PNP transistor portion 72–66–64. In FIG. 6*b*, however, the emitter region 72 is biased reversely with respect to the base region 66 in the vicinity of the collector region 62 preventing a further flow of current through the PNP type transistor portion 72–66–62. Therefore a collector current from the transistor portion 72–66–64 is taken out from the output terminal 20.

If the magnetic field applied across the transistor is reversed in polarity to point from the front to the rear side of the plane of FIG. 4 (which is represented by the symbol "cross in circle" shown in FIG. 4), then the stream of electrons is deflected into the direction of the curved arrow 29 shown in FIG. 4. Therefore a current from the transistor portion 72–66–62 increases, and simultaneously a current from the transistor portion 72–66–64 decreases. As a result, a current appearing across the output terminals 20 and 22 results predominantly from the transistor portion 72–66–62.

The output terminals 20 and 22 are also adapted to provide an output voltage in accordance with the strength of the magnetic field applied across the transistor. Since the collector regions 62 and 64 are connected to the negative side of the source 58 through the respective resistors 54, a difference between currents flowing into the collector regions 62 and 64 as above described can be taken out from the output terminals 20 and 22 through the resistors 54 as a difference in voltage drops across the latter.

Thus it will be appreciated that, by utilizing the redistribution of charge due to the Hall effect and the charge itself, the emitter-to-base voltage is automatically changed to amplify the signal.

It is recalled that the emitter junction 74 has its surface substantially disposed in parallel to the direction in which the electrons flow through the base region 66 from the electrode 76 to the electrode 78. That surface of the emitter junction 74 is substantially perpendicular to the direction of the applied magnetic field and therefore is substantially parallel to a direction in which the Hall effect generates electromotive force within the base region 66. That is, its emitter junction 74 has the surface disposed in parallel not only to the direction of the transverse electric field established in the base region 66, but also substantially parallel to the direction of the electromotive force due to the Hall effect. This permits the Hall electromotive force to be greatly increased. This Hall electromotive force high in magnitude is applied as an input to the transistor across the emitter and base regions to provide a high amplification. This can be mathematically described by using the above-mentioned equation $$V_H=(R_H I_c H)/(t).$$

That equation describes the Hall electromotive force $V_H$ as being directly proportional to the Hall coefficient $R_H$, the current $I_c$ flowing through the base region 66 from the electrode 78 to the electrode 76, and the magnetic field strength H, and inversely proportional to the thickness $t$ of the Hall element. Because the surface of the emitter junction 72 is parallel to the direction of the Hall electromotive force as above described, the thickness $t$ of the Hall element is effectively equivalent to the thickness of the base region 66 and therefore can be rendered very thin. Accordingly the Hall electromotive force $V_H$ can be very high.

One of the differences between the arrangement as shown in FIG. 2 and the present arrangement, such as illustrated in FIGS. 4 and 5, is that in the arrangement of FIGS. 4 and 5 the Lorentz's force is exerted upon the majority carriers, traveling in a direction parallel to the surface of the emitter junction. This provides a wide range over which the Lorentz's force is effective leading to the efficient utilization of the Hall effect.

Referring back to FIGS. 4 and 5, an impurity concentration will be described by way of example. The N type substrate 60 had an impurity concentration of $5 \times 10^{14}$ atoms per cubic centimeter, the two P type collector regions 62 and 64 had an impurity concentration of $1 \times 10^{18}$ atoms per cubic centimeter, the N type base region 66 had an impurity concentration of $5 \times 10^{16}$ atoms per cubic centimeter and the P type emitter region 74 had an impurity concentration of $1 \times 10^{20}$ atoms per cubic centimeter. However it is to be understood that the invention should not be restricted to the figures just specified.

While the emitter region 72 has been described as being perpendicular to the direction of the transverse electric field established in the base region 66 or the direction of the current flowing through the latter, it is to be understood that the emitter region may be disposed within the base region 66 so as to intersect such a direction at an angle other than right angles while providing satisfactory operation. Also, if desired, a separate collector region may be disposed in a gap formed between the collector regions 62 and 64 and connected in a manner similar to that described in conjunction with the latter regions for the purpose of providing a collector current in the case no magnetic field is applied across the transistor.

While the invention has been described in conjunction with the double collector, or single emitter transistor, it is to be understood that the same is equally applicable to transistors of double emitter-double collector, double emitter-single collector, single emitter-single collector type etc.

Figure 7A:
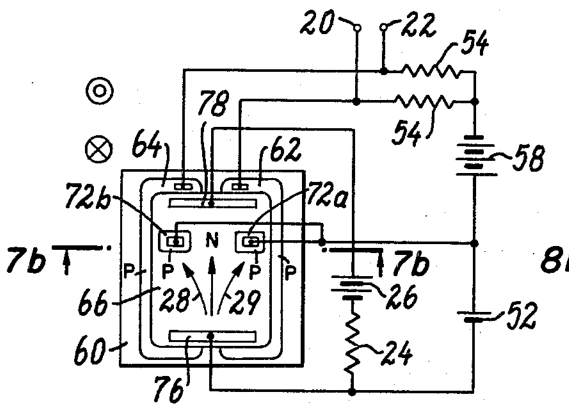
FIGS. 7 through 9 are views illustrating different embodiments of the invention wherein the Figures designated by the reference character a are diagrams similar to FIG. 4 and the Figures designated by the reference character b are cross sectional views corresponding to FIG. 5.
Figure 7B:
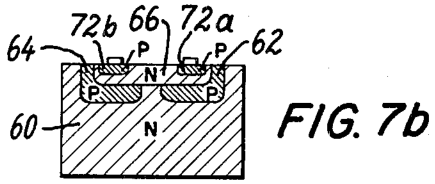

FIG. 7, wherein like reference numerals designate the components identical or corresponding to those shown in FIGS. 4 and 5, shows a double emitter-double collector transistor constructed in accordance with the principles of the invention and by a planar technique well known in the art. FIG. 7*a* is a top plan view of the transistor and FIG. 7*b* is a cross sectional view taken along the line VII*b*—VII*b* of FIG. 7*a*. The arrangement is substantially identical to that shown in FIGS. 4 and 5, with the exception that the emitter region 72 as shown in FIGS. 4 and 5 is divided into two portions 72*a* and *b* connected together to the source 26. A line interconnecting the emitter regions 72*a* and *b* is substantially perpendicular to the direction of the transverse electric field established in the base region 66 or the direction of current flowing through the latter. In the arrangement shown in FIGS. 4 and 5 the middle portion of the emitter region 72 is not effectively operated upon applying a magnetic field across the transistor as above described. For this reason the middle portion of the emitter 74 as shown in FIGS. 4 and 5 is omitted to decrease useless currents included in currents flowing from the emitter regions 72*a* and *b* to the collector regions 62 and 64 respectively.

Figure 8A:
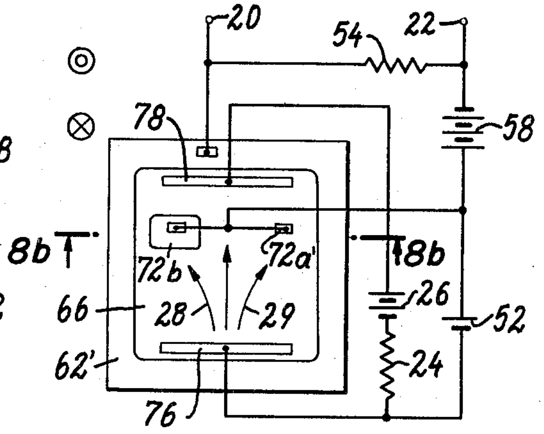
Figure 8B:
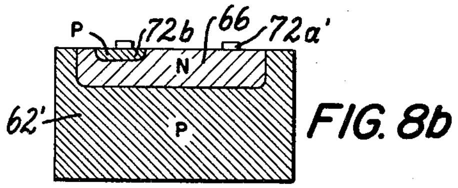

A single emitter-single collector transistor constructed in accordance with the principles of the invention by using a well known planar technique is shown in FIG. 8 wherein FIG. 8*a* is a top plan view of the transistor and FIG. 8*b* is a cross sectional view taken along the line VIII*b*—VIII*b* of FIG. 8*a*. In FIG. 8, a single collector region 62′ is in the form of a rectangular annulus completely enclosing the periphery of the base region 66. Then the collector region 62′ is directly connected to one of the output terminals, the terminal 20 in the illustrated example, while the other output terminal 22 is connected to both the junction of the resistor 54 and the negative side of the source 58 with the remaining one of resistors 54 as shown in FIG. 4 or 7 omitted. Furthermore, an ohmic electrode 74*a* is affixed to the base region 66 in place of one of emitter regions as shown in FIGS. 7*a* and *b*, in this case the righthand region 74*a*. A line connecting the emitter region 74*b* to the electrode 72'*a* is perpendicular to the direction of the transverse electric field established in the base region 66 or the direction of current flowing through the latter. In other respects the arrangement is identical to that shown in FIGS. 7*a* and *b* and like reference numerals designate the components identical to those shown in FIGS. 7*a* and *b*.

Figure 9A:
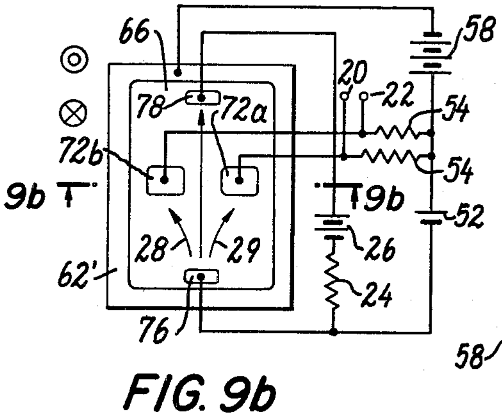
Figure 9B:
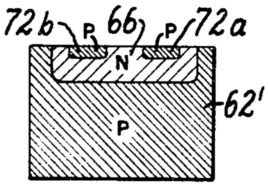

The invention is equally applicable to double emitter-single collector transistors such as shown in FIG. 9 wherein like reference numerals designate the components identical or corresponding to FIGS. 4 and 5, or FIGS. 7 or 8. FIG. 9*a* is a top plan view of the transistor and FIG. 9b is a cross sectional view taken along the line IX*b*—IX*b* of FIG. 9*a*. The transistor illustrated has been constructed by a well known planar technique and includes the single collector region 62' such as shown in FIG. 8 and a pair of bilaterally spaced emitter regions 72*a* and *b* such as shown in FIG. 7. The collector region 62' is directly connected to the negative side of the source 58 and the pair of emitter regions 72*a* and *b* are connected to a pair of output terminals 20 and 22, respectively, and through the individual resistors 54 to the junction of the positive sides of both sources 58 and 52. In other respects the arrangement is identical to that shown in FIG. 7 or 8. The arrangement can not provide a high output voltage across the output terminals 20 and 22, but it is capable of being operated with a low signal whose voltage is sufficiently less than the diffusion voltage across the emitter and base regions.

The abovementioned arrangements of the invention have a wide variety of applications to the fields of magnetic measurements and current measurements etc. and also of magnetic tape readers, key board switches, transformer secondaries, memories, transducers for converting the physical displacement to the electrical energy, power generators, tachometers, and contact-less volume controls, etc.

Furthermore, the magnetically operated transistors of the invention, as above described, are effectively applicable to four layer semiconductor devices such as, thyristors with satisfactory results. Such applications of the invention will now be described in conjunction with FIG. 10 et seq. wherein like reference numerals designate the components similar or corresponding to those shown in the previous Figures.

Figure 10:
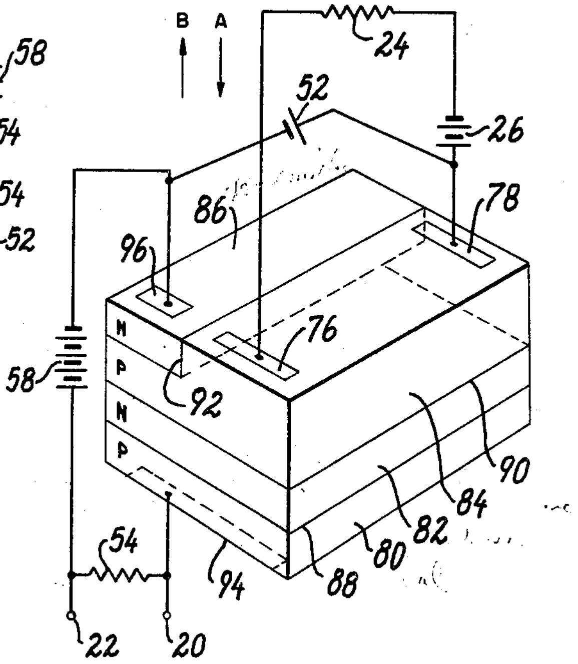
FIG. 10 is a schematic perspective view of one form of the invention applied to the four layer semiconductor device with the associated electric circuit also illustrated.

In FIG. 10 there is illustrated a semiconductor device including a four layer semiconductor element having incorporated thereinto a Hall effect element in accordance with the principles of the invention. The arrangement illustrated comprises a P type collector region 80, a second N type base region 82, a first P type base region 84 and an N type emitter region 86 stacked on one another in the named order to form a four layer semiconductor device. The N type emitter region 86 is laterally aligned with one portion of the first P type base region 84. In the four layer device PN junctions 88, 90 and 92 are formed between the regions 80 and 82, between the region 82 and 84, and between the regions 84 and 86, respectively. The arrangement further comprises a pair of ohmic electrodes 76 and 78 disposed in spaced parallel relationship on that portion of the first base region 84 which does not have extending therethrough the PN junction 92 formed between the regions 84 and 86 and adjacent both ends of the exposed surface thereof. Another pair of main electrodes 94 and 96 are disposed in ohmic contact with the collector and emitter regions 80 and 84, respectively, in such positions that the electrode 94 is located at that end of the region 80 below the electrode 76 on the base region 84 and the electrode 96 is substantially aligned with the electrode 76.

The ohmic electrodes 76 and 78 are connected across a series combination of an auxiliary source 26 of direct current and a resistor 24 with the electrode 78 rendered positive with respect to the electrode 76. It is noted that the electrodes 76 and 78 are positioned on the first base region 84 such that the source 26 establishes a transverse electric field parallel to the PN emitter junction 92 within the base region 84 between the electrodes. A main source 58 of electric power is connected across the electrodes 94 and 96 through a load resistor 54. In the case illustrated the source 58 is shown as being of direct current to render the electrode 94 positive with respect to the electrode 96. Then the resistor 54 is connected across a pair of output terminals 20 and 22. The main source 58 serves to forwardly bias the PN junction 88 between the regions 80 and 82 while at the same time reversely biasing the PN junction 90 between the regions 82 and 84. Furthermore, a biasing source 52 of direct current is connected across the electrodes 78 and 89. It is noted that the biasing source 52 is adapted to be adjusted to apply to the junction 92 between the regions 84 and 86 a forward, reverse or null bias as desired.

Assuming that the source 52 has been adjusted to apply a null bias to the PN emitter junction 92, the operation of the arrangement will now be described. The source 26 establishes a transverse electric field in the first base region 84 between the electrodes 78 and 76. As above described, the electrodes 76 and 78 have been positioned on the exposed surface of the first base region 84 so as to render that electric field substantially parallel to the PN emitter junction 92. Due to the transverse electric field, the majority carriers, in this case the holes, flow through the first P type base region 84 from the electrode 78 to electrode 76 in a direction substantially parallel to the PN emitter junction 92. Then a magnetic field is applied across the four layer semiconductor device in the direction of the arrow A shown in FIG. 10, or a direction substantially parallel to the surface of the PN emitter junction 92. As in the arrangement shown in FIGS. 4 and 5, the magnetic field cooperates with the transverse electric field or the stream of holes to generate an electromotive force in a direction substantially normal to that portion of the PN junction 92 surface extending between the electrodes 76 and 96 due to a Lorentz's force. This causes the stream of holes to be deflected away from the emitter region 86. Therefore that portion of the first base region 84 adjacent the emitter region 86 is depleted in holes and has only negative ions left thereon, thus leading to a decrease in potential thereof. As a result, the PN emitter junction 92 is reversely biased to have a minimum number of the carriers or the electrons and holes passing therethrough.

If the magnetic field changes in polarity from the direction of the arrow A to the direction of the arrow B shown in FIG. 10, then the stream of holes as above described is deflected toward the emitter region 86 due to the reversal of the direction of action of the Lorentz's force. This permits that portion of the first base region 84 adjacent the emitter region 86 to be enhanced in holes or in positive charge leading to an increase in its potential. Consequently the PN junction 92 is forwardly biased and the carriers passing therethrough become extremely great. With the source 58 connected across the main electrodes 94 and 96, the reversal of the polarity of the applied magnetic field reflects upon a voltage drop across the load resistor 54 and is taken out from the output terminals 20 and 22 as a voltage thereacross.

From the foregoing it will be appreciated that the utilization of the Hall effect exhibited by the first base region 94 and the electrodes 76 and 78, permits the control of the equivalent to the gating current applied to the four layer semiconductor device.

Figure 11:
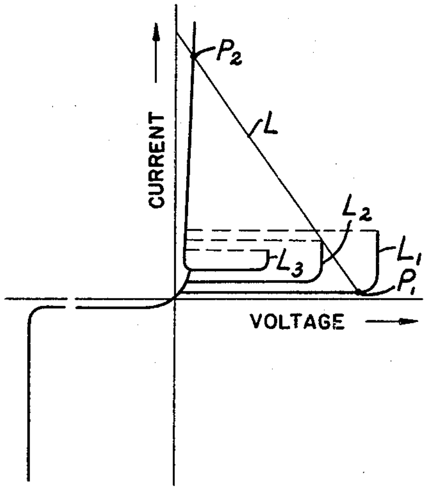
FIG. 11 is a graph of the current-to-voltage characteristic of the device shown in FIG. 10.

The switching operation of the device shown in FIG. 10 will now be described with reference to FIG. 11 wherein there is typically illustrated the current-to-voltage characteristic of a PNPN type four layer semiconductor device and the axis of ordinates represents a current while the axis of abscissas represents a voltage. In FIG. 11, the first quadrant illustrates the forward current plotted against the voltage and the third quadrant illustrates the reverse current plotted against the voltage for the PNPN device.

From FIG. 11 it is seen that with a gating current maintained null, the device has a high breakover voltage describing a locus as shown at curve L1. As the gating current increases, the device progressively decreases in breakover voltage as shown at curves L2 and L3 denoting the forward current-to-voltage characteristics for different gating currents in FIG. 11. It is recalled that the gating current or a current injected into the PN emitter junction 92 can be controlled through the utilization of the Hall effect. For example, an increase in the magnetic field strength applied across the device of FIG. 10 can exhibit the same effect as an increase in gating current. Therefore, when the source 92 has forwardly biased the device of FIG. 10 to a point L1 at which the curve L1 intersects a load curve L as shown in FIG. 11, it in its OFF position. A magnetic field can be applied across the device sufficient to decrease the breakover voltage thereof to such an extent that it is shown for example at curve L2. Then a forward current flowing through the device increases along the load curve L until it reaches a point P2 at which the load curve L intersects the breakdown curve for the device. That is the device is turned ON.

Referring back to FIG. 10, the semiconductor device includes the PN emitter junction 92 extending in parallel to the direction of the electric field established in the first base region 84 between the electrodes 76 and 78 and separated from the electric field. Accordingly the PN emitter junction is put in a biased state which slowly changes lengthwise thereof. In other words, the first base region 84 is lower in potential on that portion thereof adjacent the electrode 76, whereas it is higher in potential on that portion thereof adjacent the electrode 78. This means that a potential difference between the emitter and base regions 86 and 84 respectively is difficult to control satisfactorily. In addition the useless current is high in magnitude leading to an unnecessary increase in current capacity of the device.

Figure 12:
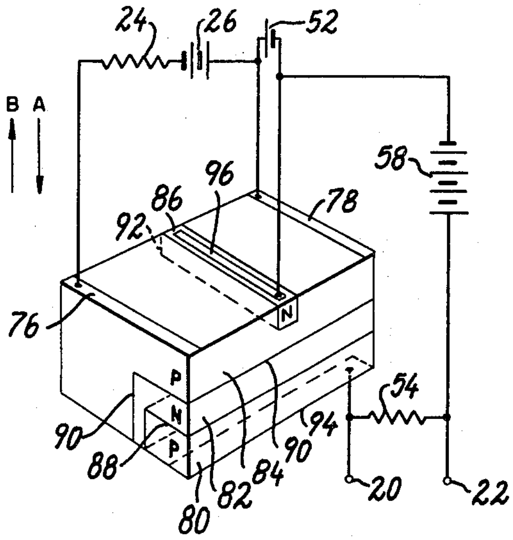
FIGS. 12 through 14 are views similar to FIG. 10 but illustrating different modifications of the device shown in FIG. 10.

These disadvantages can be eliminated by the provision of an arrangement shown in FIG. 12 wherein like reference numerals designate the components identical or corresponding to those illustrated in FIG. 10. The arrangement illustrated is principally different from that shown in FIG. 10 in that in FIG. 12 the elongated N type emitter region 86 is disposed in the first P type base region 84 to traverse entirely the latter between the electrodes 76 and 78. That is, the emitter region 86 is located at a position within a transverse electric field established between the electrodes 76 and 78 by the source 26 and substantially orthogonally to the direction of the electric field. Then the P type collector region 80 and the second N type base region 82 are disposed on the righthand portion of the semiconductor device, as viewed in FIG. 12, and also spatially orthogonal to the emitter region 84 for a purpose which will be apparent hereinafter. In other words, the collector and second base regions are disposed on the righthand one of two sections into which the device is divided in a direction parallel to the direction of the electric field or the direction of the current and perpendicular to the emitter region. In other respects the arrangement is identical to that shown in FIG. 10.

When a magnetic field is applied across the device in the direction of the arrow A shown in FIG. 12, or a direction substantially perpendicular to the PN emitter junction 92, the emitter region 86 is forwardly biased on the righthand portion thereof as viewed in FIG. 12 and reversely biased on the lefthand portion thereof as will readily be understood from the description for FIGS. 4, 5, 10. On the contrary, if the magnetic field is applied across the device in the direction of the arrow B shown in FIG. 12, then the emitter region 86 is biased forwardly on the lefthand portion thereof as viewed in FIG. 12 and reversely on the righthand thereof. Therefore the electrons are injected into the first base region 84 from the emitter region 86 regardless of the polarity of the magnetic field. Thus the second base and collector regions 82 and 80, respectively, have been disposed on the righthand portion as viewed in FIG. 12 of the device in order to permit only those electrons injected into the righthand portion of the first base region 84 to flow into the same.

By properly decreasing the width of the elongated emitter region 86, the arrangement of FIG. 12 can be free from the disadvantages as previously described in conjunction with FIG. 10. That is to say, a potential difference between the emitter and base regions 86 and 84 can be readily adjusted and the useless current decreases to diminish the unnecessary current capacity of the device.

If desired, the elongated emitter region 86 may be disposed in the first base region 84 obliquely rather than substantially perpendicularly to the direction of the electric field established in the latter region. Also the collector and second base region may be disposed on the righthand portion as viewed in FIG. 12 of the device.

Figure 13:
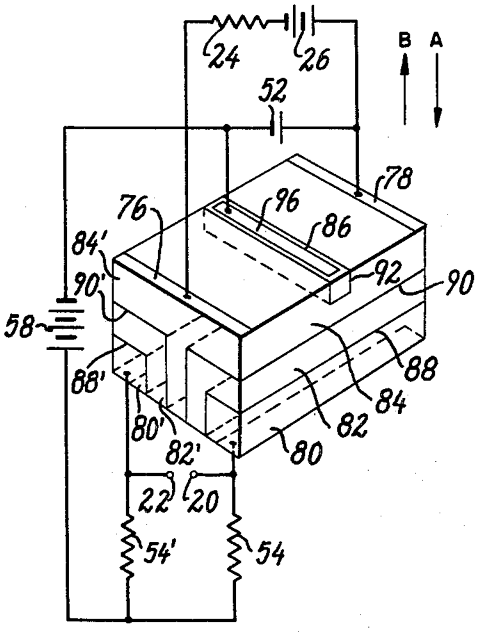

The invention is further applicable to magnetically operated, bidirectional four layer semiconductor devices which will be subsequently described in conjunction with FIG. 13. In FIG. 13 like reference numerals designate the components similar or corresponding to those shown in FIG. 12. As shown in FIG. 13, the PNPN structure including the regions 80, 82, 84 and 86 as shown on the righthand portion of FIG. 12 is juxtaposed with its replica, while the emitter region 86 identical to that shown in FIG. 12 and the first base region 84 are common to the two. The components of one of the structures are designated by the same primed reference numerals denoting the corresponding components of the other structure except for the components common to both structures. In other respects the arrangement is identical to that shown in FIG. 12.

If a magnetic field is applied across the device in either of the directions of the arrows A or B shown in FIG. 13, then one of the PNPN structures in turned ON while the other structure is turned OFF as will be readily understood from the description made in conjunction with FIG. 10. However, it is to be noted that once one of the structures has been turned on, the reversal of the polarity of the applied magnetic field by itself is not sufficient to permit the conducting structure to become non-conducting because of the four layer device. That is, in order to turn off the conducting structure, the source 58 must be disconnected from the device.

Figure 14:
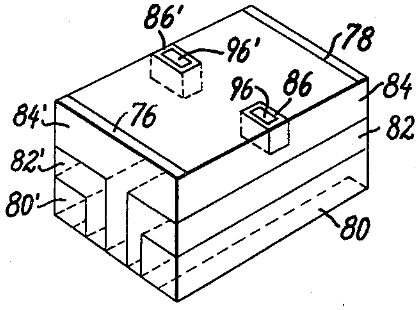

FIG. 14 shows a modification of the arrangement illustrated in FIG. 13 for the purpose of more definitely performing the ON and OFF operations. The arrangement is different from that shown in FIG. 13 only in that in FIG. 14 a pair of emitter regions 86 and 86′ and the associated ohmic electrodes 96 and 96′ are bilaterally disposed in spaced aligned relationship on the surface of the first base region 86 common to both PNPN structures. The direction in which both emitter regions 86 and 86′ are aligned with each other is substantially perpendicular to the direction of the established electric field or the direction of the stream of the majority carriers. In FIG. 14 like reference numerals designate the components identical to those shown in FIG. 13 with the associated electric circuit omitted.

The four layer semiconductor devices as above described perform the ON and OFF operations and can be effectively used as switching devices for key board switches, memories, and computers etc.

While the invention has been illustrated and described in conjunction with several preferred embodiments thereof it is to be understood that numerous changes and modifications may be resorted to without departing from the spirit and scope of the invention. For example, the invention is equally applicable to NPN type transistors and NPNP type four layer devices with the polarity of the sources reversed from that illustrated. While the invention has been described in terms of planar transistors it is to be understood that it is applicable to mesa type transistors with satisfactory results. Further upon forming the emitter or collector region, the Schottkey barrier may be substituted for the junction. In addition, semiconductor devices to which the invention is applicable may be produced from any of semiconductive silicon, germanium, compounds of III and V elements etc. by any of diffusion, epitaxial growth, and alloying techniques, etc. well known in the art.

What we claim is:

1. A magnetically operated semiconductor device comprising, in combination, a wafer of semiconductive material including a first collector region of one type conductivity, a base region of another type conductivity disposed to form a collector junction with said collector region, and a first emitter region of said one type conductivity disposed to form an emitter junction with said base region, a pair of electrodes disposed in ohmic contact with said base region to interpose said emitter region therebetween, a first source of direct current connected across said pair of electrodes to produce a transverse electric field in that portion of said base region disposed between said electrodes, said emitter junction having a surface disposed in substantially parallel relationship with respect to the direction of said transverse electric field, and means for applying a magnetic field across the device substantially perpendicularly to said surface of said emitter junction to generate an electromotive force in parallel to said surface of said emitter junction due to the Hall effect resulting from the interaction of said magnetic field and said transverse electric field.

2. A magnetically operated semiconductor device as claimed in claim 1 wherein said base region is greater in area than said emitter junction.

3. A magnetically operated semiconductor device as claimed in claim 1 wherein a second source of direct current has first and second terminals connected respectively to said emitter region and a selected one of said electrodes on said base region to preliminarily bias said emitter junction to substantially zero voltage.

4. A magnetically operated semiconductor device as claimed in claim 1 wherein a second source of direct current has first and second terminals connected respectively to said emitter region and a selected one of said electrodes on said base region to preliminarily bias said emitter junction in the forward direction.

5. A magnetically operated semiconductor device as claimed in claim 1 wherein said wafer further includes a second collector region spaced from said first collector region and disposed to form a second collector junction with said base region to provide two transistor means responsive to a change in electromotive force due to a change in the applied magnetic field, wherein one of said transistor means including one of said collector regions increases in collector current while at the same time the other said transistor means including the other collector region decreases in collector current.

6. A magnetically operated semiconductor device as claimed in claim 1 wherein said emitter region is disposed on said base region in a position at which it intersects the direction of said transverse electric field.

7. A magnetically operated semiconductor device as claimed in claim 1 wherein said emitter region is disposed on said base region substantially orthogonally to the direction of said transverse electric field.

8. A magnetically operated semiconductor device as claimed in claim 1 wherein said wafer further includes a second collector region spaced from said first collector region and disposed to form a second collector junction with said base region to provide two transistor means responsive to a change in electromotive force due to a change in the applied magnetic field wherein one of said transistor means including one of said collector regions increases in collector current while at the same time the other said transistor means including the other collector region decreases in collector current, and further comprising first and second resistors, and a second source of direct current having first and second terminals connected respectively to said emitter region and to one side of both of said resistors, the other sides of said resistors being connected to said respective collector regions, wherein changes in collector currents are differentially detectable at said other sides of said resistors.

9. A magnetically operated semiconductor device as claimed in claim 8 wherein at least one of said resistors is a variable resistor.

10. A magnetically operated semiconductor device as claimed in claim 1, in which said wafer further includes a second emitter region spaced from said first emitter region and disposed to form a second emitter junction with said base region, wherein said emitter regions are aligned with each other normal to the direction of said transverse electric field.

11. A magnetically operated semiconductor device as claimed in claim 1 wherein said wafer further includes a second emitter region spaced from said first emitter region and disposed to form a second emitter junction with said base region, and further comprising a second source of direct current having a pair of terminals connected respectively to both said two emitter regions and to said collector region, wherein a change in electromotive force due to the Hall effect causes changes in emitter current.

12. A magnetically operated semiconductor device comprising, in combination, a wafer of semiconductive material including a collector region of one type conductivity, a base region of another type conductivity disposed to form a collector junction with said collector region, and an emitter region of said one type conductivity disposed to form an emitter junction with said base region, a first electrode and a second electrode disposed in ohmic contact with said base region to interpose said emitter region therebetween, a source of direct current connected across said first and second electrodes to produce a transverse electric field in said base region between said first and second electrodes, a third electrode disposed in ohmic contact with said base region between said first and second electrodes and at a position in which said emitter region is aligned with said third electrode in a direction substantially perpendicular to the direction of said transverse electric field, said emitter junction including a principal surface disposed substantially in parallel to the direction of said transverse electric field, and means for applying a magnetic field across the device substantially perpendicularly to said surface of said emitter region to generate an electromotive force parallel to said surface of said emitter region due to the Hall effect resulting from the interaction of said magnetic field and said transverse electric field.

13. A magnetically operated semiconductor device as claimed in claim 12 wherein said third electrode is electrically connected to said emitter region to apply across the emitter junction a change in potential on the base region caused from a variation in electromotive force due to the Hall effect.

14. A magnetically operated semiconductor device comprising, in combination, a four layer structure including successively an emitter region, a first base region, a second base region and a collector region of alternate conductivity semiconductor material, said emitter region transversing said first base region to form a PN emitter junction therebetween and said base region having an extending portion providing a surface disposed in a coplanar surface relationship with an outer principle surface of said emitter region, a pair of electrodes disposed in ohmic contact on said first base region surface, a source of direct current connected across said pair of electrodes to produce a transverse electric field across said second base region between said electrodes, said emitter junction including a surface disposed in substantially parallel relationship with respect to the direction of said transverse electric field, and means for applying across said structure a magnetic field substantially perpendicular to said surface of said emitter junction to generate an electromotive force in parallel to said surface of said emitter junction due to the Hall effect caused from the interaction of said magnetic field and said transverse electric field.

15. A magnetically operated semiconductor device as claimed in claim 14 wherein said emitter region is interposed transversely between said electrodes, and wherein said collector region and said second base region are located in one of two sections into which said structure is divided in a directional parallel to the direction of said transverse electric field and perpendicular to said transverse direction of said emitter region.

16. A magnetically operated semiconductor device as claimed in claim 14 further comprising a biasing source of direct current connected between said emitter region and a selected one of said electrodes on said first base region to preliminarily bias said emitter junction to a predetermined magnitude.

17. A magnetically operated semiconductor device as claimed in claim 14, in which said emitter region is interposed transversely between said electrodes, and in which said four layer structure includes a pair of sections spaced in juxtaposed relationship and disposed parallel to the direction of said transverse electric field and perpendicular to said emitter region, each of said sections including a portion of said collector region and a portion of said second base region, wherein said emitter and first base regions and said pair of electrodes are common to both said sections.

18. A magnetically operated semiconductor device as claimed in claim 14 in which said emitter region extends transversely between said electrodes, and said emitter, collector and second base regions are divided into a pair of spaced sections disposed in a justaposed relationship parallel to the direction of said transverse electric field and perpendicular to said transverse emitter region sections, wherein each said section includes a separate collector, second base and emitter region, and wherein said first base region and said pair electrodes are common to both said sections.

19. A magnetically operated semiconductor device as claimed in claim 14, in which said emitter region extends transversely between said electrodes, and in which said collector and second base regions are divided into a pair of spaced sections disposed in a justaposed relationship parallel to the direction of said transverse electric field and perpendicular to said emitter region, wherein each said section includes a separate collector and second base region, and wherein said emitter and first base regions and said pair of electordes are common to both said sections.

20. A magnetically operated semiconductor device as claimed in claim 14 wherein said four layer structure includes a pair of sections divided in juxtaposed relationship in a direction parallel to the direction of said transverse electric field and perpendicular to said emitter region, each of said sections including its own collector, second base, and emitter regions while said first base region and said pair electrodes are common to both said sections, and wherein a direction in which said emitter regions are aligned with each other is substantially perpendicular to the direction of said transverse electric field.

21. A magnetically operated semiconductor device comprising, in combination, a four layer structure including an emitter region, a first base region, a second base region and a collector region of alternate conductivity, said emitter region being juxtaposed with said first base region to form a PN emitter junction between the same and one portion of said first base region, a pair of spaced parallel electrodes disposed in ohmic contact with said first base region, a source of direct current connected across said pair of electrodes to produce a transverse electric field in said first base region between said electrodes, said emitter region including a surface disposed substantially in parallel to the direction of said transverse electric field, and means for applying a magnetic field across the device substantially in parallel to said surface of said emitter junction to generate an electromotive force parpendicularly to said surface of said emitter junction due to the Hall effect resulting from the interaction of said magnetic field and said transverse electric field.

* * * * *